(12) United States Patent
Wang et al.

(10) Patent No.: US 12,075,644 B2
(45) Date of Patent: Aug. 27, 2024

(54) ARRAY SUBSTRATE AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 771 days.

(21) Appl. No.: 17/270,969

(22) PCT Filed: May 15, 2020

(86) PCT No.: PCT/CN2020/090578
§ 371 (c)(1),
(2) Date: Feb. 24, 2021

(87) PCT Pub. No.: WO2020/233525
PCT Pub. Date: Nov. 26, 2020

(65) Prior Publication Data
US 2021/0257581 A1 Aug. 19, 2021

(30) Foreign Application Priority Data
May 17, 2019 (CN) .......................... 201910412226.5

(51) Int. Cl.
*H10K 50/824* (2023.01)
*H10K 59/12* (2023.01)
(Continued)

(52) U.S. Cl.
CPC ....... *H10K 50/824* (2023.02); *H10K 59/1216* (2023.02); *H10K 59/122* (2023.02);
(Continued)

(58) Field of Classification Search
CPC ............. H10K 50/824; H10K 59/1216; H10K 59/122; H10K 59/124; H10K 59/126; H10K 59/1315; H10K 71/00; H10K 59/1201
See application file for complete search history.

(56) References Cited

U.S. PATENT DOCUMENTS

2004/0141223 A1 7/2004 Kurashina et al.
2006/0146209 A1* 7/2006 Kretz ................ G02F 1/136213
349/38

(Continued)

FOREIGN PATENT DOCUMENTS

CN 108231847 6/2018
CN 109119440 1/2019
(Continued)

OTHER PUBLICATIONS

IQSearch Download-202312131505.pdf (Year: 2023).*
(Continued)

*Primary Examiner* — William B Partridge
*Assistant Examiner* — David Paul Sedorook
(74) *Attorney, Agent, or Firm* — Dority & Manning, P.A.

(57) ABSTRACT

An array substrate includes: a base; light shield layers and a first auxiliary electrode that are disposed on the base; at least one insulating layer covering the light shield layers and the first auxiliary electrode; first electrodes that are disposed on the at least one insulating layer, a conductive connection portion; a pixel definition layer defining light-emitting regions and covering the conductive connection portion; organic light-emitting layers disposed on the first electrodes and located in the light-emitting regions defined by the pixel definition layer; and at least one second electrode covering the pixel definition layer and the organic light-emitting layers. A second electrode is electrically connected to the conductive connection portion through a via that penetrates (Continued)

through the pixel definition layer. The conductive connection portion is electrically connected to the first auxiliary electrode through a via that penetrates through the at least one insulating layer.

12 Claims, 6 Drawing Sheets

(51) Int. Cl.
    *H10K 59/121*     (2023.01)
    *H10K 59/122*     (2023.01)
    *H10K 59/124*     (2023.01)
    *H10K 59/126*     (2023.01)
    *H10K 59/131*     (2023.01)
    *H10K 71/00*     (2023.01)

(52) U.S. Cl.
    CPC ......... *H10K 59/124* (2023.02); *H10K 59/126* (2023.02); *H10K 59/1315* (2023.02); *H10K 71/00* (2023.02); *H10K 59/1201* (2023.02)

(56) References Cited

U.S. PATENT DOCUMENTS

| | | | |
|---|---|---|---|
| 2015/0097172 A1 | 4/2015 | Han et al. | |
| 2015/0179724 A1 | 6/2015 | Lee et al. | |
| 2016/0133681 A1* | 5/2016 | Nam | H10K 59/1216 |
| | | | 257/40 |
| 2016/0141349 A1 | 5/2016 | Yun et al. | |
| 2017/0278919 A1 | 9/2017 | Matsumi | |
| 2018/0097047 A1* | 4/2018 | Jung | H10K 59/122 |
| 2018/0151120 A1* | 5/2018 | Kim | G09G 3/3291 |
| 2018/0151828 A1 | 5/2018 | Im et al. | |
| 2019/0115403 A1 | 4/2019 | Kang | |
| 2019/0206971 A1* | 7/2019 | Kim | H10K 59/123 |
| 2019/0326370 A1 | 10/2019 | Lu | |
| 2020/0127225 A1* | 4/2020 | Zhang | H10K 59/124 |

FOREIGN PATENT DOCUMENTS

| | | |
|---|---|---|
| CN | 109166895 | 1/2019 |
| CN | 110085648 | 8/2019 |

OTHER PUBLICATIONS

International Search Report (w/ English Translation) for corresponding PCT Application No. PCT/CN2020/090578, mailed on Aug. 19, 2020, 5 pages.
First Chinese Office Action (w/ English Translation) for corresponding Chinese Application No. 201910412226.5, 22 pages.

* cited by examiner

ARRAY SUBSTRATE AND METHOD FOR MANUFACTURING THE SAME, DISPLAY PANEL AND DISPLAY DEVICE

CROSS-REFERENCE TO RELATED APPLICATIONS

This application is a national phase entry under 35 USC 371 of International Patent Application No. PCT/CN 2020/090578 filed on May 15, 2020, which claims priority to Chinese Patent Application No. 201910412226.5, filed on May 17, 2019, which are incorporated herein by reference in their entirety.

TECHNICAL FIELD

Embodiments of the present disclosure relate to an array substrate and a method for manufacturing the same, a display panel and a display device.

BACKGROUND

Organic light-emitting display devices have been incorporated in an important display technology due to their advantages such as self-luminescence, fast response, wide viewing angle, high brightness, bright colors, lightness and thinness.

SUMMARY

In an aspect, an array substrate is provided. The array substrate includes: a base; light shield layers and a first auxiliary electrode that are disposed on the base; at least one insulating layer covering the light shield layers and the first auxiliary electrode; first electrodes that are disposed on the at least one insulating layer; a conductive connection portion; a pixel definition layer defining light-emitting regions and covering the conductive connection portion; organic light-emitting layers disposed on the first electrodes and located in the light-emitting regions defined by the pixel definition layer; and at least one second electrode covering the pixel definition layer and the organic light-emitting layers. A second electrode in the at least one second electrode is electrically connected to the conductive connection portion through a via that penetrates through the pixel definition layer, and the conductive connection portion is electrically connected to the first auxiliary electrode through a via that penetrates through the at least one insulating layer.

In some embodiments, the at least one insulating layer includes a buffer layer covering the light shield layers and the first auxiliary electrode, and an interlayer dielectric layer disposed on the buffer layer. The via that penetrates through the at least one insulating layer includes a first via that penetrates through the interlayer dielectric layer and the buffer layer. The conductive connection portion includes a second auxiliary electrode disposed on the interlayer dielectric layer, and the second auxiliary electrode is electrically connected to the first auxiliary electrode through the first via that penetrates through the interlayer dielectric layer and the buffer layer.

In some embodiments, the at least one insulating layer further includes a planarization layer covering the second auxiliary electrode. The via that penetrates through the at least one insulating layer includes a second via that penetrates through the planarization layer. The conductive connection portion further includes a third auxiliary electrode disposed on the planarization layer, and the third auxiliary electrode and the first electrode are disposed in a same layer. The third auxiliary electrode is electrically connected to the second auxiliary electrode through the second via that penetrates through the planarization layer. The via that penetrates through the pixel definition layer is a third via, and the second electrode is electrically connected to the third auxiliary electrode through the third via.

In some embodiments, an orthographic projection of a first electrode in the first electrodes on the base at least partially overlaps with an orthographic projection of a corresponding organic light-emitting layer on the base, and an orthographic projection of the third auxiliary electrode on the base is non-overlapping with orthographic projections of the organic light-emitting layers on the base.

In some embodiments, the array substrate further includes thin film transistors disposed between the buffer layer and the planarization layer. A first electrode in the first electrodes is electrically connected to a corresponding thin film transistor through a fourth via that penetrates through the planarization layer.

In some embodiments, orthographic projections of sources and drains of the thin film transistors on the base are non-overlapping with orthographic projections of the organic light-emitting layers on the base, and an orthographic projection of the second auxiliary electrode on the base is non-overlapping with the orthographic projections of the organic light-emitting layers on the base.

In some embodiments, an orthographic projection of a light shield layer in the light shield layers on the base at least partially overlaps with an orthographic projection of an active layer of a corresponding thin film transistor on the base.

In some embodiments, active layers of the thin film transistors are disposed between the buffer layer and the interlayer dielectric layer, and sources and drains of the thin film transistors are disposed on the interlayer dielectric layer. An active layer in the active layers includes a first portion that overlaps with the a corresponding organic light-emitting layer in a direction perpendicular to the base and a second portion that is non-overlapping with the corresponding organic light-emitting layer in the direction perpendicular to the base, and a source and a drain of a thin film transistor in the thin film transistors are electrically connected to the second portion of a corresponding active layer through vias that penetrate through the interlayer dielectric layer, respectively.

In some embodiments, the array substrate further includes capacitor electrodes disposed between the interlayer dielectric layer and the planarization layer. A capacitor electrode in the capacitor electrodes is electrically connected to a corresponding light shield layer through a fifth via that penetrates through the interlayer dielectric layer and the buffer layer, and partially overlapping with a corresponding active layer.

In some embodiments, the first auxiliary electrode includes a body portion and an extension portion that extends from the body portion toward a corresponding light shield layer. An orthographic projection of the extension portion on the base covers an orthographic projection of the first via on the base, and the orthographic projection of the extension portion on the base is non-overlapping with orthographic projections of the active layers on the base.

In some embodiments, the array substrate further includes data lines disposed on the base, and the first auxiliary electrode and the data lines are disposed in different layers.

In some embodiments, the body portion extends in a direction parallel to the data lines, and the extension portion extends in a direction perpendicular to the data lines.

In some embodiments, an orthographic projection of a light shield layer in the light shield layers on the base at least partially overlaps with an orthographic projection of a corresponding organic light-emitting layer on the base, and an orthographic projection of the first auxiliary electrode on the base is non-overlapping with the orthographic projections of the organic light-emitting layers on the base.

In another aspect, a display panel is provided. The display panel includes the array substrate as described in any of the above embodiments.

In yet another aspect, a display device is provided. The display device includes the display panel as described in any of the above embodiments.

In yet another aspect, a method for manufacturing an array substrate is provided. The method includes: providing a base; forming light shield layers and a first auxiliary electrode on the base; forming at least one insulating layer covering the light shield layers and the first auxiliary electrode; forming first electrodes on the at least one insulating layer and a conductive connection portion, the conductive connection portion being electrically connected to the first auxiliary electrode through a via that penetrates through the at least one insulating layer; forming a pixel definition layer that covers the conductive connection portion, the pixel definition layer being configured to define light-emitting regions; forming organic light-emitting layers on the first electrodes and in the light-emitting regions defined by the pixel definition layer; and forming at least one second electrode that covers the pixel definition layer and the organic light-emitting layers, a second electrode in the at least one second electrode being electrically connected to the conductive connection portion through a via that penetrates through the pixel definition layer.

In some embodiments, forming the at least one insulating layer covering the light shield layers and the first auxiliary electrode, includes: forming a buffer layer that covers the light shield layers and the first auxiliary electrode and an interlayer dielectric layer on the buffer layer. Forming the first electrodes on the at least one insulating layer and the conductive connection portion, includes: forming a second auxiliary electrode on the interlayer dielectric layer, the second auxiliary electrode being electrically connected to the first auxiliary electrode through a first via that penetrates through the interlayer dielectric layer and the buffer layer.

In some embodiments, forming the at least one insulating layer covering the light shield layers and the first auxiliary electrode, further includes: forming a planarization layer that covers the second auxiliary electrode. Forming the first electrodes on the at least one insulating layer and the conductive connection portion, further includes: forming the first electrodes and a third auxiliary electrode on the planarization layer, the third auxiliary electrode being electrically connected to the second auxiliary electrode through a second via that penetrates through the planarization layer. The via that penetrates through the pixel definition layer is a third via, and the second electrode is electrically connected to the third auxiliary electrode through the third via.

In some embodiments, before forming the planarization layer, the method further includes forming thin film transistors on the buffer layer. After forming the planarization layer, a first electrode in the first electrodes is electrically connected to a corresponding thin film transistor through a fourth via that penetrates through the planarization layer.

In some embodiments, orthographic projections of the first auxiliary electrode, the second auxiliary electrode and the third auxiliary electrode on the base are non-overlapping with orthographic projections of the organic light-emitting layers on the base.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1:
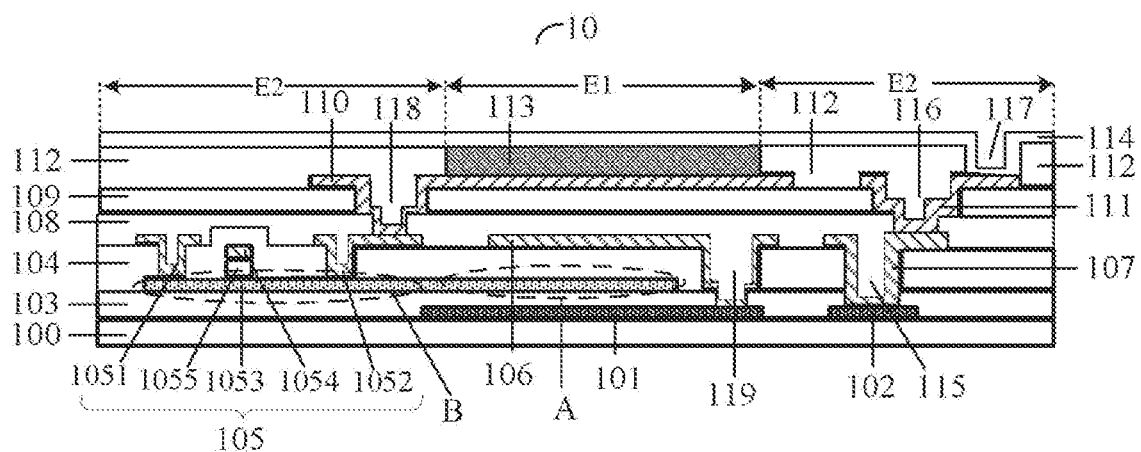
FIG. 1 is a sectional view of an array substrate, in accordance with some embodiments of the present disclosure.

Technical solutions in some embodiments of the present disclosure will be described below clearly and completely with reference to the drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed in an open and inclusive sense, i.e., "including, but not limited to". In the description, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In addition, unless otherwise defined, technical and scientific terms used herein have the same meanings as commonly understood by one of ordinary skill in the art to which the present disclosure belongs. Words "first", "second" and the like used in the present disclosure are not intended to mean any order, quantity or importance, but are merely used to distinguish different components. Similarly, similar words such as "a", "an" or "the" do not mean a quantity limit, but mean that there is at least one. In other words, a feature defined by the term "first" or "second" and similar words may include one or more of the features, either explicitly or implicitly. In the description of the embodiments of the present disclosure, the term "a plurality of/the plurality of" means two or more unless otherwise specified. A word such as "include" or "comprise" means that an element or item appearing before the word covers the element(s) or item(s) appearing after the word and the equivalent thereof without excluding other elements or items. A word "connect", "couple" or a similar word thereof is not limited to physical or mechanical connections, but may include electrical connections, whether direct or indirect. "Upper", "lower", "left", "right", etc., are only used to indicate a relative positional relationship, and when the absolute position of the described object is changed, the relative positional relationship may also be changed accordingly.

Those skilled in the art will understand that the term "substantially" herein may also include embodiments having "completely", "entirely", "all" and the like. Therefore, in the embodiments, the term "substantially" may also be removed. Where applicable, the term "substantially" may also refer to 90% or more, such as 95% or more, particularly 99% or more, even more particularly 99.5% or more, including 100%. The term "and/or" particularly relates to one or more of the items mentioned before and after "and/or". For example, the phrase "item 1 and/or item 2" and similar phrases may refer to one or more of item 1 and item 2.

The use of "applicable to" or "configured to" means an open and inclusive expression, which does not exclude devices that are applicable to or configured to perform additional tasks or steps.

In addition, the use of "based on" is meant to be open and inclusive, since a process, step, calculation or other action that is "based on" one or more of the said conditions or values may, in practice, be based on additional conditions or exceed the said values.

Exemplary embodiments are described herein with reference to sectional views and/or plan views as idealized exemplary drawings. In the accompanying drawings, thicknesses of layers and regions are exaggerated for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown as a rectangle generally has curved features. Therefore, regions shown in the accompanying drawings are schematic in nature and their shapes are not intended to show actual shapes of the regions in a device and are not intended to limit the scope of the exemplary embodiments.

An organic light-emitting display device includes a plurality of pixels arranged in an array, and each pixel generally includes an organic light-emitting element, thin film transistors, and the like. The organic light-emitting element includes, for example, an anode, a cathode and an organic light-emitting layer between the anode and the cathode.

If organic light-emitting display devices are distinguished according to light-emitting manners, the organic light-emitting display devices may include bottom-emission organic light-emitting display devices and top-emission organic light-emitting display devices. Compared with a bottom-emission organic light-emitting display device, a top-emission organic light-emitting display device may generally achieve a higher resolution. In the top-emission organic light-emitting display device, a cathode of an organic light-emitting element located in a light exit direction is generally made of a transparent conductive material. The transparent conductive material generally has a relatively high resistance, and a cathode with a relatively high resistance generally leads to a decrease in brightness, efficacy and service life of the organic light-emitting element. Therefore, it is generally necessary to reduce such an undesirable high resistance of the cathode of the organic light-emitting element by means of an auxiliary electrode.

Based on this, some embodiments of the present disclosure provide an array substrate that may solve disadvantages caused by the cathode, with a relatively high resistance, of the organic light-emitting element of the top-emission organic light-emitting display device. As shown in FIG. 1, the array substrate 10 includes: a base 100; light shield layers 101 and a first auxiliary electrode 102 that are disposed on the base 100; at least one insulating layer (e.g., a buffer layer 103, an interlayer dielectric layer 104, a passivation layer 108 and a resin layer 109 shown in FIG. 1) that covers the light shield layers 101 and the first auxiliary electrode 102; first electrodes 110 that are disposed on the at least one insulating layer; a conductive connection portion (e.g., a second auxiliary electrode 107 and a third auxiliary electrode 111 shown in FIG. 1); a pixel definition layer 112 that defines light-emitting regions E1 and covers the conductive connection portion; organic light-emitting layers 113 disposed on the first electrodes 110 and located in the light-emitting regions E1 defined by the pixel definition layer 112; and second electrode(s) 114 that cover the pixel definition layer 112 and the organic light-emitting layers 113. The second electrode 114 is electrically connected to the conductive connection portion through a via that penetrates through the pixel definition layer 112, and the conductive connection portion is electrically connected to the first auxiliary electrode 102 through a via that penetrates through the at least one insulating layer.

Compared with a conventional technical solution that an auxiliary electrode is manufactured by using a metal layer where gates or data lines are located, in the array substrate provided by the embodiments of the present disclosure, the first auxiliary electrode is manufactured by using metal for manufacturing the light shield layers, which may improve a limitation of a line width of a metal layer for manufacturing gates or data lines on a line width of an auxiliary electrode, and increase an area of the auxiliary electrode, thereby reducing a resistance of the second electrode of the organic light-emitting element more effectively. Moreover, the second electrode is electrically connected to the first auxiliary electrode by means of the conductive connection portion, which is beneficial to reduce a depth of a via, to reduce a technical difficulty of electrodes in lapping, and to improve a lap yield of the auxiliary electrode and the second electrode.

Based on this, for example, as shown in FIG. 1, the at least one insulating layer includes the buffer layer 103. The buffer layer 103 covers the light shield layers 101 and the first auxiliary electrode 102. The via that penetrates through the at least one insulating layer includes a via that penetrates through the buffer layer 103. The conductive connection portion includes the second auxiliary electrode 107 disposed on the buffer layer 103, and the second auxiliary electrode 107 is electrically connected to the first auxiliary electrode 102 through the via that penetrates through the buffer layer 103.

For another example, as shown in FIG. 1, the at least one insulating layer further includes a planarization layer (e.g., the passivation layer 108 and the resin layer 109 shown in FIG. 1). The planarization layer covers the second auxiliary electrode 107. The via that penetrates through the at least one insulating layer includes a second via 116 that penetrates through the planarization layer. The conductive connection portion further includes the third auxiliary electrode 111 disposed on the planarization layer, and the third auxiliary electrode 111 is disposed in a same layer as the first electrodes 110. The third auxiliary electrode is electrically connected to the second auxiliary electrode 107 through the second via 116 that penetrates through the planarization layer. The via that penetrates through the pixel definition layer 112 is a third via 117, and the second electrode 114 is electrically connected to the third auxiliary electrode 111 through the third via 117.

In the above examples, the second electrode 114 is electrically connected to the first auxiliary electrode 102 by means of the second auxiliary electrode 107 and the third auxiliary electrode 111, which is beneficial to reduce the depth of the via, to reduce the technical difficulty of electrodes in lapping, and to improve the lap yield of the first auxiliary electrode and the second electrode 114.

Hereinafter, the present disclosure will be described through several specific embodiments. In order to keep the description of the embodiments of the present disclosure clear and concise, detailed descriptions of known functions and known components may be omitted. In a case where any component in the embodiments of the present disclosure appears in more than one figure, the component may be represented by a same reference numeral in each figure.

Figure 2:
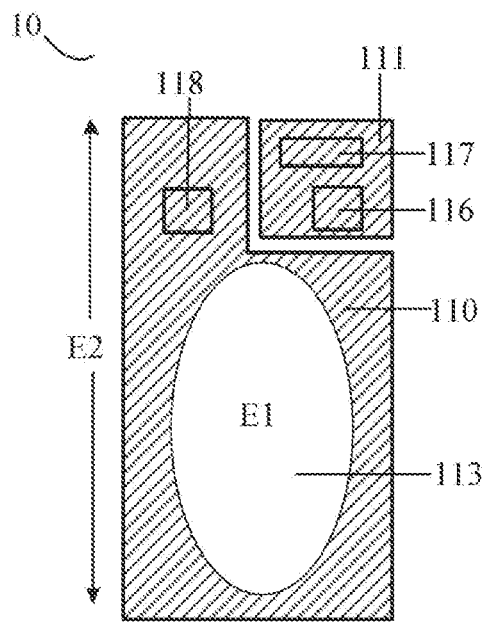
FIG. 2 is a plan view of a pixel structure in an array substrate, in accordance with some embodiments of the present disclosure.

FIG. 1 schematically illustrates a sectional view of the array substrate 10, in accordance with some embodiments of the present disclosure, and FIG. 2 schematically illustrates a plan view of a pixel structure in the array substrate 10, in accordance with some embodiments of the present disclosure. It will be noted that, the array substrate 10 includes a plurality of pixels arranged in an array, and FIGS. 1 and 2 only schematically show a part of structures in one of the plurality of pixels. As shown in FIGS. 1 and 2, a pixel region includes the light-emitting region E1 and a non-light-emitting region E2. The light-emitting region E1 and the non-light-emitting region E2 will be described in detail later.

As shown in FIGS. 1 and 2, the array substrate 10 includes the base 100, the light shield layers 101, the first auxiliary electrode 102, the second auxiliary electrode 107, the third auxiliary electrode 111, the second electrode 114 of the organic light-emitting element, and the like. As shown in FIGS. 1 and 2, the first auxiliary electrode 102 is electrically connected to the second auxiliary electrode 107 through a first via 115 that penetrates through the interlayer dielectric layer 104 and the buffer layer 103, the second auxiliary electrode 107 is electrically connected to the third auxiliary electrode 111 through the second via 116, and the third auxiliary electrode 111 is electrically connected to the second electrode 114 through the third via 117. By means of the second auxiliary electrode 107 and the third auxiliary electrode 111, an electrical connection of the first auxiliary electrode 102 and the second electrode 114 is realized.

Hereinafter, a structure of the array substrate 10 will be described in more detail with reference to FIGS. 1 and 2.

The base 100 may be, for example, a quartz substrate, a glass substrate, a plastic substrate, or any other substrate made of a suitable material, which is not specifically limited. For example, in some examples, the base 100 may also be a flexible base substrate. The flexible base substrate is, for example, bendable and light-transmissive. Examples of a material of the flexible base substrate include at least one of polyimide, polycarbonate, polyethylene and polyacrylate, or any combination thereof.

The light shield layers 101 and the first auxiliary electrode 102 are disposed in a same layer on the base 100. In a process of manufacturing the array substrate 10, the light shield layers 101 and the first auxiliary electrode 102 may be formed by patterning a same metal layer. Based on this, for example, an orthographic projection of the light shield layer 101 on the base 100 at least partially overlaps with an orthographic projection of the organic light-emitting layer 113 on the base 100, and an orthographic projection of the first auxiliary electrode 102 on the base 100 is non-overlapping with the orthographic projections of the organic light-emitting layers 113 on the base 100. In other words, at least a portion of the light shield layer 101 is located in the light-emitting region E1 of the pixel of the array substrate 10, and the first auxiliary electrode 102 is located in the non-light-emitting region E2 of the pixel of the array substrate 10. The "light-emitting region" used herein refers to a region occupied and covered by the organic light-emitting layer in each pixel, rather than a region actually irradiated by light emitted by the organic light-emitting layer. Similarly, the "non-light-emitting region" used herein refers to a region other than the region occupied and covered by the organic light-emitting layer in each pixel, rather than a region that is not irradiated by the light emitted by the organic light-emitting layer. For example, in a top-emission array substrate, by making the orthographic projection of the light shield layer 101 on the base 100 and the orthographic projection of the organic light-emitting layer 113 on the base 100 at least partially overlap, the light emitted by the organic light-emitting layer may be effectively prevented from being emitted downwards through the base 100, so that a utilization rate of the light emitted by the organic light-emitting layer may be improved, and an efficiency of an upward emission of a light source may be improved.

In addition, the array substrate 10 further includes thin film transistors disposed between the buffer layer 103 and the planarization layer. In this case, the light shield layer 101 may further be disposed below the thin film transistor 105 (as shown in FIG. 1). For example, the orthographic projection of the light shield layer 101 on the base 100 may at least partially overlap with an orthographic projection of an active layer of the thin film transistor on the base 100. In a case where the light shield layer 101 is disposed below the thin film transistor, the light shield layer 101 may further prevent the thin film transistor in the array substrate 10 from generating a photo-generated carrier due to an irradiation of an external light, thereby preventing an undesired leakage current.

The light shield layers 101 and the first auxiliary electrode 102 may be composed of a metal material such as Ag, Cu, Al or Mo, or a multilayer metal such as MoNb/Cu/MoNb, or an alloy material of metal such as AlNd or MoNb, or may also be composed of a stacked structure formed by metal such as ITO/Ag/ITO or a transparent conductive oxide (e.g., ITO or AZO).

As shown in FIG. 1, the array substrate 10 further includes the buffer layer 103, and the buffer layer 103 covers the light shield layers 101 and the first auxiliary electrode 102. The buffer layer 103 may prevent impurity ions in the base 100 from diffusing into a circuit layer including thin film transistors formed later, and prevent adverse effects on characteristics such as threshold voltages and leakage currents of the thin film transistors. In addition, the buffer layer 103 may further be used to planarize a surface of the base 100. A material for the buffer layer 103 includes, but is not limited to, a dielectric material such as SiOx, SiNx or SiON, or various new organic insulating materials, or a high dielectric constant (high-K) material such as AlOx, HfOx or TaOx.

As shown in FIG. 1, the array substrate 10 further includes the interlayer dielectric layer 104 disposed on the buffer layer 103, thin film transistors 105, and capacitor electrodes 106 and the second auxiliary electrode 107 that are disposed on the interlayer dielectric layer 104. A material of the interlayer dielectric layer 104 may be same as the material of the buffer layer 103, which will not be repeated herein in this embodiment. The thin film transistor 105 includes a source (drain) 1051, a drain (source) 1052, the active layer 1053, a gate 1054, a gate insulating layer 1055, and the like. The thin film transistor 105 may be, for example, a driving thin film transistor of the organic light-emitting element, which may be configured to control a light emission of the organic light-emitting element. In this embodiment, a structure of the thin film transistor 105 may be, for example, a top gate structure, a bottom gate structure (e.g., a back channel etch (BCE) structure, an etch stop layer (ESL) structure), which is not limited. In addition, the thin film transistor 105 may be, for example, an amorphous silicon thin film transistor, a polysilicon (e.g., low-temperature polysilicon, high-temperature polysilicon) thin film transistor, a metal oxide thin film transistor, an organic thin film transistor, or the like. Therefore, a material of the active layer 1053 may be correspondingly an amorphous silicon material (e.g., a-Si), a polysilicon material (e.g., p-Si), a metal oxide material (e.g., a-IGZO, ZnON or IZTO), an organic material (e.g., hexathiophene and polythiophene), or the like. Based on this, for example, as shown in FIG. 1, orthographic projections of the source (drain) 1051 and the drain (source) 1052 of the thin film transistor 105 on the base 100 are non-overlapping with the orthographic projections of the organic light-emitting layers 113 on the base 100. In other words, the source (drain) 1051 and the drain (source) 1052 of the thin film transistor 105 are located in the non-light-emitting region E2 of the pixel of the array substrate 10, which is beneficial to increase an area of the capacitor electrode 106.

As shown in FIG. 1, the capacitor electrode 106 is electrically connected to the light shield layer 101 through a fifth via 119 that penetrates through the interlayer dielectric layer 104 and the buffer layer 103. In the example shown in FIG. 1, the active layer 1053 includes a first portion A that overlaps with the organic light-emitting layer 113 in a direction perpendicular to the base 100 and a second portion B that is non-overlapping with the organic light-emitting layer 113 in the direction perpendicular to the base 100, and an orthographic projection of the first portion A of the active layer 1053 on the base 100 at least partially overlaps with the orthographic projection of the light shield layer 101 on the base 100. Therefore, in a pixel region, the light shield layer 101, the buffer layer 103, the active layer 1053, the interlayer dielectric layer 104 and the capacitor electrode 106 may constitute a first capacitor with a stacked structure. The first capacitor may be a pixel capacitor, which may be configured to charge and discharge the thin film transistor 105.

The second auxiliary electrode 107 is electrically connected to the first auxiliary electrode 102 through the first via 115 that penetrates through the interlayer dielectric layer 104 and the buffer layer 103. An orthographic projection of the second auxiliary electrode 107 on the base 100 is non-overlapping with the orthographic projections of the organic light-emitting layers 113 on the base 100. In other words, the second auxiliary electrode 107 is located in the non-light-emitting region E2 of the pixel of the array substrate 10.

The sources (drains) 1051 and the drains (sources) 1052 of the thin film transistors 105, the capacitor electrodes 106 and the second auxiliary electrode 107 are disposed in a same layer, and may be formed by correspondingly patterning a same metal layer in the process of manufacturing the array substrate 10. Materials of the sources (drains) 1051, the drains (sources) 1052, the capacitor electrodes 106 and the second auxiliary electrode 107 may be, for example, same as the material of the light shield layers 101.

As shown in FIG. 1, the array substrate 10 further includes the planarization layer, and the planarization layer covers the thin film transistors 105, the capacitor electrodes 106 and the second auxiliary electrode 107. The planarization layer may be a single film layer or a stacked structure composed of a plurality of film layers. For example, the planarization layer may be a stacked structure composed of the passivation layer 108 and the resin layer 109. A material of the passivation layer 108 may be, for example, the same as the material of the buffer layer 103. A material of the resin layer 109 includes, but is not limited to, a material having a planarization effect, such as a polysiloxane-based material, an acrylic-based material or a polyimide-based material.

As shown in FIG. 1, the array substrate 10 further includes the organic light-emitting elements and the third auxiliary electrode 111 that are disposed on the planarization layer. The organic light-emitting element includes the first electrode 110, the second electrode 114, and the organic light-emitting layer 113 disposed between the first electrode 110 and the second electrode 114. It will be noted that, in this embodiment, although FIG. 1 only shows the organic light-emitting element including the first electrode 110, the second electrode 114 and the organic light-emitting layer 113, the organic light-emitting element may further include one or more of a hole injection layer, a hole transport layer, an electron injection layer and an electron transport layer, as needed.

The first electrode 110 may be, for example, an anode of the organic light-emitting element. An orthographic projection of the first electrode 110 on the base 100 at least partially overlaps with the orthographic projection of the organic light-emitting layer 113 on the base 100. In other words, the first electrode 110 is at least partially located in the light-emitting region E1 of the pixel of the array substrate 10. An orthographic projection of the third auxiliary electrode 111 on the base 100 is non-overlapping with the orthographic projections of the organic light-emitting layers 113 on the base 100. In other words, the third auxiliary electrode 111 is located in the non-light-emitting region E2 of the pixel of the array substrate 10.

As shown in FIG. 1, the first electrode 110 is electrically connected to the drain (source) 1052 of the thin film transistor 105 through a fourth via 118 that penetrates through the resin layer 109 and the passivation layer 108. The third auxiliary electrode 111 that is separated from the first electrode 110 is electrically connected to the second auxiliary electrode 107 through the second via 116 that penetrates through the resin layer 109 and the passivation layer 108. The first electrodes 110 and the third auxiliary electrode 111 are disposed in a same layer, and may be formed by correspondingly patterning a same metal layer in the process of manufacturing the array substrate 10. A material of the first electrodes 110 and the third auxiliary electrode 111 may be, for example, the same as the material of the light shield layer 101.

As shown in FIG. 1, the organic light-emitting layer 113 is disposed on the first electrode 110 and located in the light-emitting region E1 defined by the pixel definition layer 112. For example, in the light-emitting region E1 defined by the pixel definition layer 112, the organic light-emitting layer 113 may be formed by an inkjet printing process, which will be described in detail in a method for manufacturing an array substrate 10 later, which will not be repeated herein. The organic light-emitting layers 113 may be, for example, red light-emitting layers, green light-emitting layers and blue light-emitting layers, so that a display device including the organic light-emitting layers 113 may realize a color display.

The second electrode 114 covers the pixel definition layer 112 and the organic light-emitting layers 113. The second electrode 114 may be, for example, a cathode of the organic light-emitting element. As shown in FIG. 1, the second electrode 114 is electrically connected to the third auxiliary electrode 111 through the third via 117 that penetrates through the pixel definition layer 112. With reference to the above description, it is clearly understood that the electrical connection of the first auxiliary electrode 102 and the second electrode 114 may be realized by means of the second auxiliary electrode 107 and the third auxiliary electrode 111.

In order to better realize the top emission of the organic light-emitting element, a material of the second electrode 114 may generally be a transparent conductive material, and the transparent conductive material includes, but is not limited to, one or more of ITO, IZO, IGZO and ZnO. However, the second electrode 114 made of the transparent conductive material with a relatively small thickness generally has a relatively high resistance. In a case where there is no auxiliary electrode, as a resistance of the second electrode 114 increases, a low power supply voltage (VSS) supplied to the organic light-emitting element increases, thereby reducing a brightness, an efficacy and a service life of the organic light-emitting element. In some embodiments of the present disclosure, the second electrode 114 is electrically connected to the first auxiliary electrode 102 by means of the second auxiliary electrode 107 and third auxiliary electrode 111 (the first, second and third auxiliary electrodes are generally made of a material with a relatively low resistance), thereby reducing the resistance of the second electrode 114. Compared with the conventional technical solution in which the auxiliary electrode is manufactured by using the metal for manufacturing the data lines, the line width of the first auxiliary electrode 102 provided by the embodiments of the present disclosure is not limited by the line widths of the data lines, thereby reducing the high resistance of the second electrode 114 more effectively.

As shown in FIG. 2, an elliptical region represents the light-emitting region E1 of the pixel, and a region around the elliptical region represents the non-light-emitting region E2 of the pixel. The first electrode 110 is electrically connected to the drain (source) 1052 of the thin film transistor 105 through the fourth via 118 on a left side, thereby enabling the organic light-emitting layer 113 to emit light. The third auxiliary electrode 111 is electrically connected to the second auxiliary electrode 107 through the second via 116 on a right side, and is electrically connected to the second electrode 114 above through the third via 117.

Figure 3:
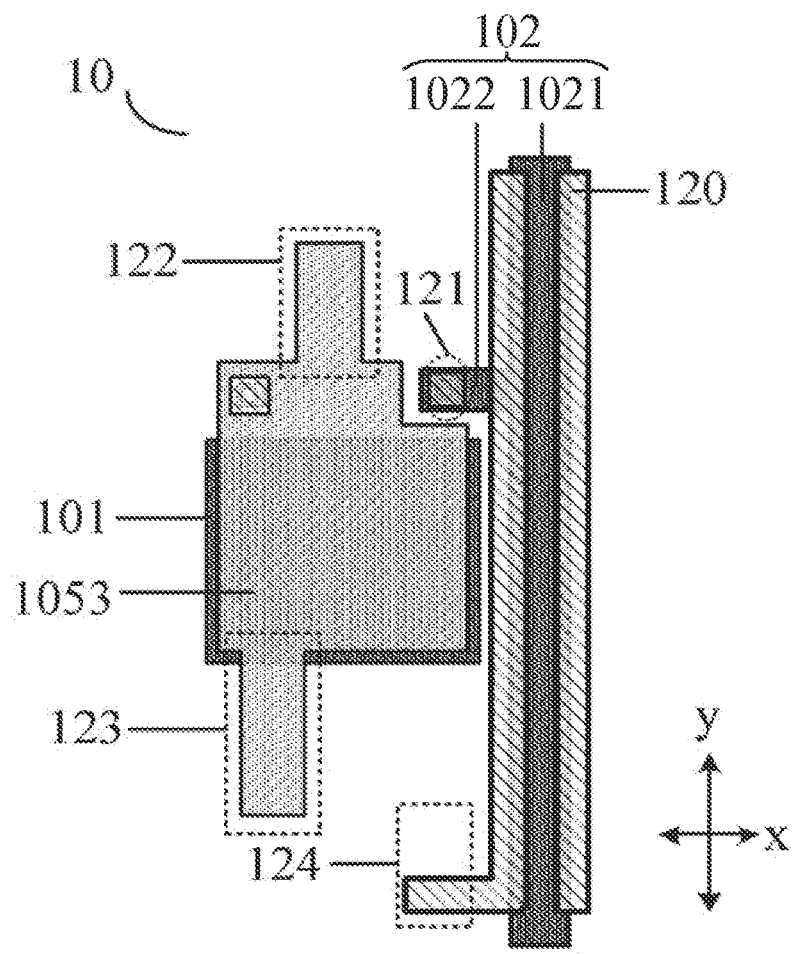
FIG. 3 is a plan view of an array substrate, in accordance with some embodiments of the present disclosure.

FIG. 3 is a plan view of the array substrate 10, in accordance with some embodiments of the present disclosure, and a relative positional relationship between the first auxiliary electrode 102 and data lines 120 (the data lines 120 are generally disposed in a same layer as the gate 1054, which is not shown in FIG. 1) may be described more clearly with reference to FIG. 3. As shown in FIG. 3, the first auxiliary electrode 102 is located below the data lines 120, and is located in a same layer as the light shield layer 101 on the left side. The first auxiliary electrode 102 includes a body portion 1021 in a longitudinal direction (i.e., y direction in FIG. 3) and an extension portion 1022 that extends from the body portion toward the light shield layer 101. Compared with a conventional method in which the first auxiliary electrode 102 and the data lines 120 are disposed in a same layer, if the first auxiliary electrode 102 and the data lines 120 are disposed in different layers, an area occupied by the first auxiliary electrode 102 and the data lines 120 in a lateral direction (i.e., x direction in FIG. 3) may be reduced, which is beneficial to improve an aperture ratio of the array substrate 10. In addition, the line width of the first auxiliary electrode 102 is not limited by the line widths of the data lines 120, which is beneficial to realize a wider first auxiliary electrode 102, thereby reducing the high resistance of the second electrode 114 more effectively. The first auxiliary electrode 102 further includes the extension portion that extends from the body portion toward the light shield layer 101, and the extension portion extends at least partially beyond one of the two adjacent data lines in the lateral direction and into the non-light-emitting region E2 of the pixel (an orthographic projection of the extension portion 1022 on the base 100 is non-overlapping with an orthographic projection of the active layer 1053 on the base 100 by appropriately reducing an area of the active layer 1053). An elliptical region 121 in FIG. 3 represents a region where the first via 115, the second via 116 and the third via 117 are located. That is, the first via 115, the second via 116 and the third via 117 are all located in the non-light-emitting region E2 of the pixel of the array substrate 10. It will be noted that, areas of the first via 115, the second via 116 and the third via 117 may be increased sequentially, and their corresponding sizes may be designed according to a specific scheme of a product, which is not limited in this embodiment. Moreover, a positional relationship between the first via 115, the second via 116 and the third via 117 is not specifically limited, as long as they are all located in the non-light-emitting region E2 of the pixel of the array substrate 10, which is not limited in this embodiment. If the elliptical region 121 is disposed in a region between the adjacent data lines, it is likely that a space between the adjacent data lines is increased due to an area occupied by the elliptical region, thereby resulting in an occupation of more pixel area. A structure of the first auxiliary electrode 102 provided by this embodiment may enable the elliptical region 121 where the first via 115, the second via 116 and the third via 117 are located to utilize the non-light-emitting region E2 of the array substrate 10, thereby reducing an area of the occupied pixel region and increasing pixels per inch (PPI) of the array substrate 10. Three rectangular dashed boxes 122, 123 and 124 in FIG. 3 respectively represent a sensing thin film transistor, a driving thin film transistor and a switching thin film transistor in the pixel of the array substrate 10, and corresponding structures thereof and circuit connection relationships are known to those skilled in the art, which will not be repeated herein.

In summary, the technical solutions may have the following advantageous technical effects: I. electrical connections between the first auxiliary electrode 102 and the second auxiliary electrode 107, between the second auxiliary electrode 107 and the third auxiliary electrode 111, and between the third auxiliary electrode 111 and the second electrode 114 are realized through corresponding vias, and thus there is no difficulty in device development, and a strong practicality, which is beneficial to improve the lap yield between electrodes and reduce a production cost; II. the second electrode 114 is electrically connected to the first auxiliary electrode 102 by means of the second auxiliary electrode 107 and the third auxiliary electrode 111, thereby avoiding the lap fracture between electrodes caused by the deep via through which the second electrode 114 is directly electrically connected to the first auxiliary electrode 102; III. the first auxiliary electrode 102, the second auxiliary electrode 107 and the third auxiliary electrode 111 are all located in the non-light-emitting region E2 of the pixel of the array substrate 10, and do not occupy an area of an opening region of the pixel, which is beneficial to improve an aperture ratio of the display panel; IV. the structure of the first auxiliary electrode 102 may enable the first via 115, the second via 116 and the third via 117 to advantageously utilize the non-light-emitting region E2 of the array substrate 10 to reduce the area of the opening region occupying the pixel, which is beneficial to increase a PPI of the display panel; V. by providing the first auxiliary electrode 102 in the same layer as the light shield layer 101, instead of providing the first auxiliary electrode 102 in a same layer as the gate and the data line, the line width of the first auxiliary electrode 102 may be increased effectively, thereby reducing the resistance of the second electrode 114 effectively.

Figure 4:
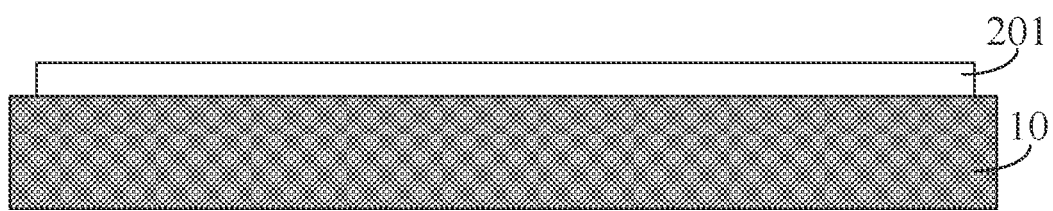
FIG. 4 is a sectional view of a display panel, in accordance with some embodiments of the present disclosure.

Some embodiments of the present disclosure further provide a display panel 20. Referring to FIG. 4, the display panel 20 includes any array substrate 10 as described in any of the above embodiments. Technical effects of the display panel 20 may be referred to the technical effects of the array substrate 10 as described in the above embodiments, which will not be repeated herein again.

As shown in FIG. 4, the display panel 20 may further include an encapsulation cover plate 201. The encapsulation cover plate 201 may be an encapsulation film or an encapsulation substrate. The encapsulation cover plate 201 may block water vapor, so as to prevent circuits and organic light-emitting elements on the base of the array substrate 10 from being corroded by water and oxygen.

Figure 5:
FIG. 5 is a schematic diagram of a display device, in accordance with some embodiments of the present disclosure.

Some embodiments of the present disclosure further provide a display device 30. As shown in FIG. 5, the display device 30 includes any display panel 20 as described in any of the above embodiments. The display device 20 may be, for example, a TV, a digital camera, a mobile phone, a watch, a tablet computer, a notebook computer, a navigator, or any appropriate component. Technical effects of the display device may be referred to the technical effects of the array substrate as described in the above embodiments, which will not be repeated herein again.

Figure 6:
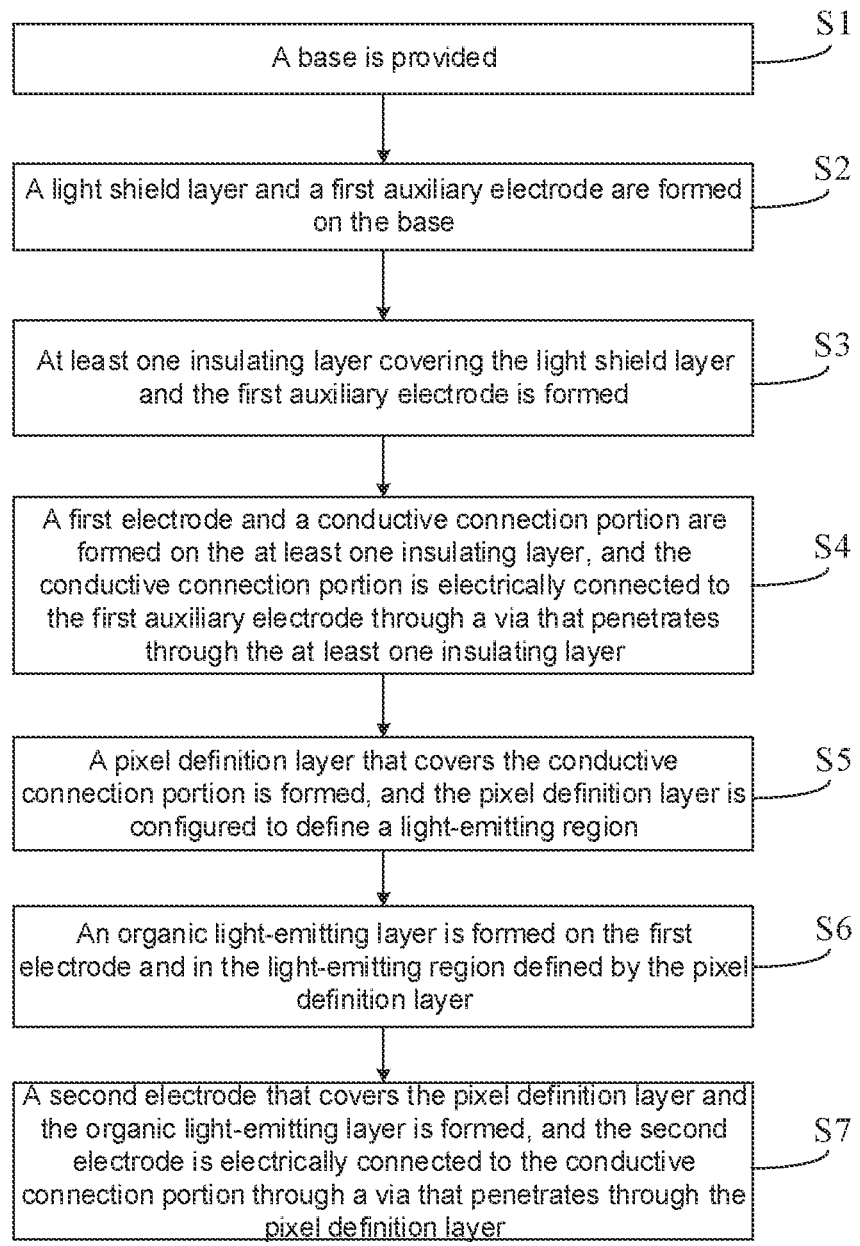
FIG. 6 is a flow diagram of a method for manufacturing an array substrate, in accordance with some embodiments of the present disclosure.

Some embodiments of the present disclosure further provide a method for manufacturing an array substrate. As shown in FIG. 6, the method includes S1 to S7. In S1, a base is provided. In S2, light shield layers and a first auxiliary electrode are formed on the base. In S3, at least one insulating layer covering the light shield layers and the first auxiliary electrode is formed. In S4, first electrodes are formed on the at least one insulating layer and a conductive connection portion is formed, and the conductive connection portion is electrically connected to the first auxiliary electrode through a via that penetrates through the at least one insulating layer. Here, the step of forming the first auxiliary electrode in S4 may be performed during S3. In S5, a pixel definition layer that covers the conductive connection portion is formed, and the pixel definition layer is configured to define light-emitting regions. In S6, organic light-emitting layers are formed on the first electrodes and in the light-emitting regions defined by the pixel definition layer. In S7, second electrode(s) that cover the pixel definition layer and the organic light-emitting layers is formed, and the second electrode is electrically connected to the conductive connection portion through a via that penetrates through the pixel definition layer.

Compared with a conventional technical solution in which an auxiliary electrode is manufactured by using a metal layer where gates or data lines are located, in the array substrate formed through S1 to S7, the first auxiliary electrode is manufactured by using metal for manufacturing the light shield layers, which may improve a limitation of a line width of a metal layer for manufacturing gates or data lines on a line width of an auxiliary electrode, and increase an area of the auxiliary electrode, thereby reducing a resistance of the second electrode of the organic light-emitting element more effectively. Moreover, the second electrode is electrically connected to the first auxiliary electrode by means of the conductive connection portion, which is beneficial to reduce a depth of a via, to reduce a technical difficulty of electrodes in lapping, and to improve a lap yield of the auxiliary electrode and the second electrode.

Based on this, for example, forming the at least one insulating layer covering the light shield layers and the first auxiliary electrode, includes: forming a buffer layer that covers the light shield layers and the first auxiliary electrode. Forming the first electrodes on the at least one insulating layer and the conductive connection portion, includes: forming a second auxiliary electrode on the buffer layer. The second auxiliary electrode is electrically connected to the first auxiliary electrode through a first via that penetrates through the buffer layer.

For another example, forming the at least one insulating layer covering the light shield layers and the first auxiliary electrode, further includes: forming a planarization layer that covers the second auxiliary electrode. Forming the first electrodes on the at least one insulating layer and the conductive connection portion, further includes: forming the first electrodes and a third auxiliary electrode on the planarization layer. The third auxiliary electrode is electrically connected to the second auxiliary electrode through a second via that penetrates through the planarization layer. The via that penetrates through the pixel definition layer is a third via, and the second electrode is electrically connected to the third auxiliary electrode through the third via.

For yet another example, before forming the planarization layer, the method further includes: forming thin film transistors on the buffer layer. After forming the planarization layer, the first electrode is electrically connected to the thin film transistor through a fourth via that penetrates through the planarization layer.

In the above examples, the second electrode may be electrically connected to the first auxiliary electrode by means of the second auxiliary electrode and the third auxiliary electrode 111, which is beneficial to reduce the depth of the via, to reduce the technical difficulty of electrodes in lapping, and to improve the lap yield of the first auxiliary electrode and the second electrode.

FIGS. 7A to 7G schematically illustrate flow diagrams of the process of manufacturing the array substrate 10. Hereinafter, the method for manufacturing the array substrate 10 will be described in detail with reference to FIGS. 7A to 7G.

Figure 7A:
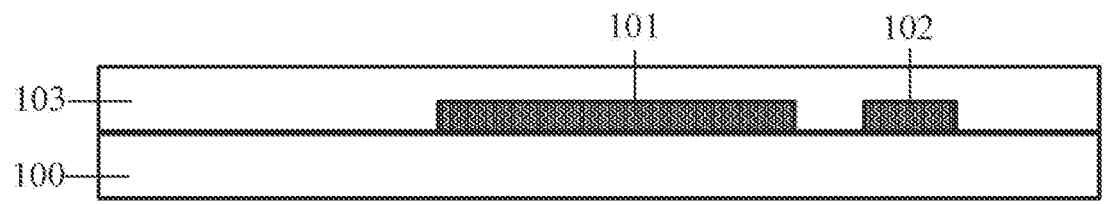
FIGS. 7A to 7G are structural diagrams illustrating steps of manufacturing an array substrate, in accordance with some embodiments of the present disclosure.

As shown in FIG. 7A, the base 100 is provided first. The base 100 may be, for example, a glass substrate, a quartz substrate, a plastic substrate, or any other substrate made of a suitable material. For example, in one example, the base 100 may also be a flexible base substrate. The flexible base substrate is, for example, a transparent substrate, and may be bendable.

A metal film layer is deposited on the base 100 by a sputtering process, and the metal film layer is patterned through a patterning process, so as to form the light shield layers 101 and the first auxiliary electrode 102 on the base 100. The line width of the first auxiliary electrode 102 is generally wider than the line width of the data line, which is beneficial to reduce the resistance of the second electrode formed subsequently more effectively. The light shield layers 101 and the first auxiliary electrode 102 may be composed of a metal material such as Ag, Cu, Al or Mo, or a multilayer metal such as MoNb/Cu/MoNb, or an alloy material of metal such as AlNd or MoNb, or may also be composed of a stacked structure formed by metal such as ITO/Ag/ITO or a transparent conductive oxide (e.g., ITO or AZO).

Then, through a chemical vapor deposition process or a physical vapor deposition process, a buffer film layer is deposited on the base 100 on which the light shield layers 101 and the first auxiliary electrode 102 have been formed, and the buffer film layer is patterned to form the buffer layer 103. The buffer layer 103 may, for example, prevent impurity ions in the base 100 from diffusing into a circuit layer including the thin film transistors formed later, and prevent effects on characteristics such as threshold voltages and leakage currents of the thin film transistors. In addition, the buffer layer 103 may further be used to planarize a surface of the base 100. A material for the buffer layer 103 includes, but is not limited to, a dielectric material such as SiOx, SiNx or SiON, or various new organic insulating materials, or a high dielectric constant (high-K) material such as AlOx, HfOx or TaOx.

Figure 7B:
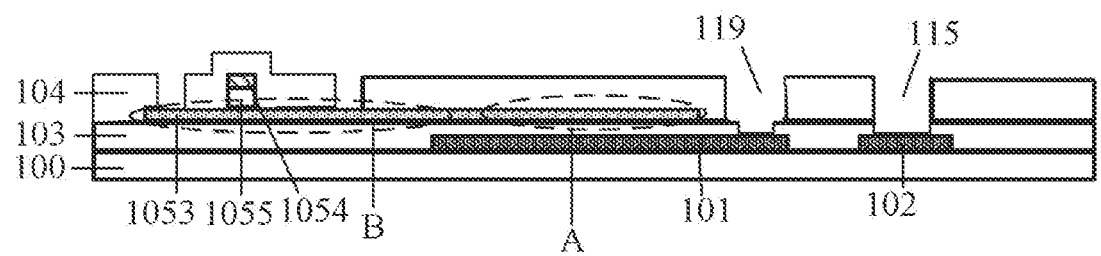

As shown in FIG. 7B, an active film layer is deposited on the buffer layer 103 through a chemical vapor deposition process or a physical vapor deposition process, and the active film layer is patterned through a patterning process, so as to form active layers 1053. The formed active layer 1053 includes a first portion A and a second portion B. An orthographic projection of the first portion A of the active layer 1053 on the base 100 at least partially overlaps with an orthographic projection of the light shield layer 101 on the base 100. A material of the active layer 1053 may be, for example, a silicon material (e.g., a-Si and p-Si), an oxide material (e.g., a-IGZO, ZnON or IZTO), or an organic material (e.g., sexithiophene or polythiophene). A corresponding formation process of the active layers 1053 composed of each material is known in the art, which will not be repeated herein.

A gate insulating layer 1055 and gates 1054 are formed on the active layers 1053. Then, an interlayer dielectric layer film is deposited on the buffer layer 103 and the active layers 1053 through a chemical vapor deposition process or a physical vapor deposition process, and an interlayer dielectric layer 104 is formed by patterning the film. Afterwards, the interlayer dielectric layer 104 is patterned again through a patterning process, so as to form both the first via 115 and a fifth via 119 that penetrate through the interlayer dielectric layer 104 and the buffer layer 103 and other required vias at corresponding positions of the interlayer dielectric layer 104.

Figure 7C:
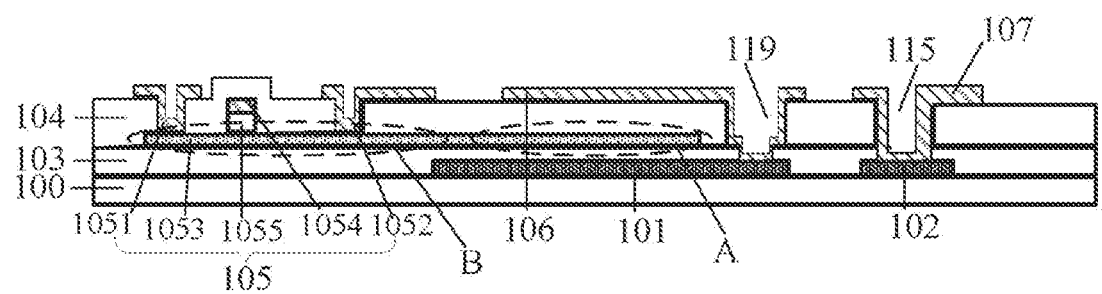

As shown in FIG. 7C, a metal layer is deposited on the interlayer dielectric layer 104 by a sputtering process, and the metal layer is patterned to form sources (drains) 1051, drains (sources) 1052, capacitor electrodes 106, and the second auxiliary electrode 107. The sources (drains) 1051, the drains (sources) 1052, the capacitor electrodes 106, and the second auxiliary electrode 107 are formed through a single patterning process, which may improve a production efficiency and save a production cost. For example, materials of the above electrodes may be same as the material of the light shield layer 101. In the example shown in FIG. 7C, although the thin film transistor 105 composed of the source (drain) 1051, the drain (source) 1052, the active layer 1053 and the gate 1054 is shown as a top gate structure, a structure of the thin film transistor 105 is not limited thereto. For example, the thin film transistor 105 may further be of a bottom gate structure (e.g., a BCE structure, an ESL structure).

The second auxiliary electrode 107 is electrically connected to the first auxiliary electrode 102 through the first via 115, and the capacitor electrode 106 is electrically connected to the light shield layer 101 through the fifth via 119. As described above, since the orthographic projection of the first portion A of the active layer 1053 on the base 100 at least partially overlaps with the orthographic projection of the light shield layer 101 on the base 100, in a pixel region, the light shield layer 101, the buffer layer 103, the active layer 1053, the interlayer dielectric layer 104 and the capacitor electrode 106 may constitute a first capacitor with a stacked structure. The first capacitor may be a pixel capacitor, which may be configured to charge and discharge the thin film transistor 105.

Figure 7D:
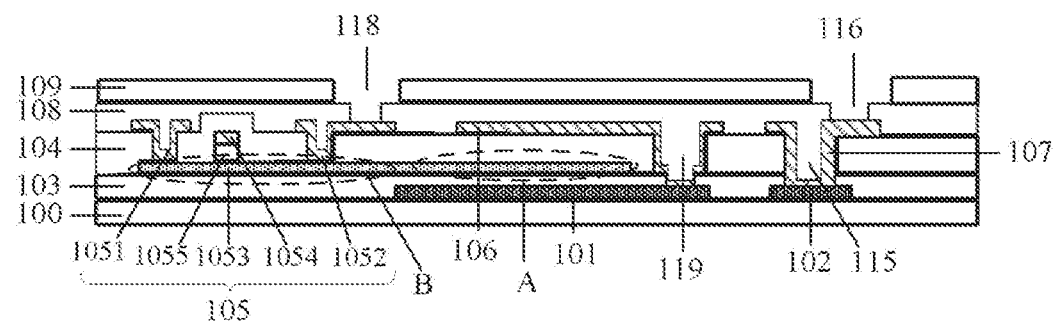

As shown in FIG. 7D, a passivation layer 108 and a resin layer 109 are sequentially formed on the interlayer dielectric layer 104. The passivation layer 108 and the resin layer 109 may be used as the planarization layer, and the planarization layer covers the thin film transistors 105, the capacitor electrodes 106 and the second auxiliary electrode 107. After the planarization layer is formed, the planarization layer is patterned through a patterning process, so as to form both the second via 116 and the fourth via 118 that penetrate through the planarization layer at corresponding positions of the planarization layer. For example, a material of the passivation layer 108 may be the same as the material of the buffer layer 103. A material of the resin layer 109 includes, but is not limited to, a material having a planarization effect, such as a polysiloxane-based material, an acrylic-based material or a polyimide-based material.

Figure 7E:
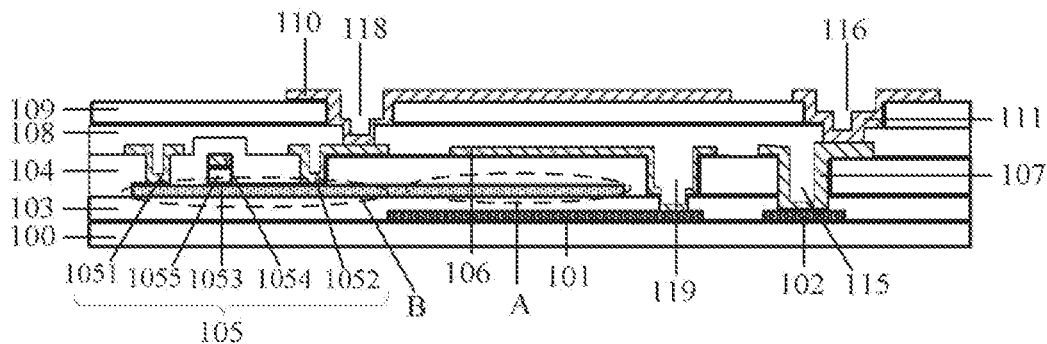

As shown in FIG. 7E, a metal film layer is deposited on the resin layer 109, and the metal film layer is patterned to form the first electrodes 110 and the third auxiliary electrode 111. The first electrodes 110 and the third auxiliary electrode 111 are formed by a single patterning process, thereby improving the production efficiency and reducing the production cost. The third auxiliary electrode 111 is electrically connected to the second auxiliary electrode 107 through the second via 116. The first electrode 110 is electrically connected to the drain (source) 1052 of the thin film transistor 105 through the fourth via 118. In this embodiment, the first electrode 110 may be an anode of the organic light-emitting element, and the thin film transistor 105 may be a driving thin film transistor of the organic light-emitting element, which may be configured to control the light emission of the organic light-emitting element. Materials of the first electrode 110 and the third auxiliary electrode 111 may be the same as the material of the light shield layer 101.

Figure 7F:
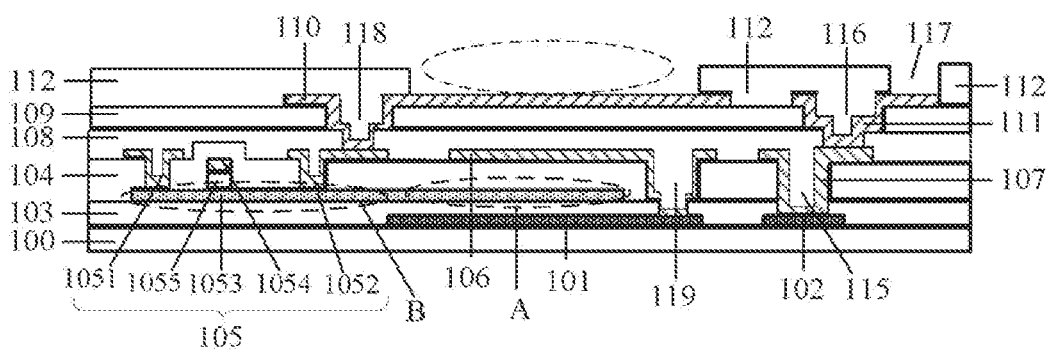

As shown in FIG. 7F, the pixel definition layer 112 is formed on the planarization layer on which the first electrodes 110 and the third auxiliary electrode 111 have been formed. The pixel definition layer 112 is used to define printing regions (referring to a dashed region above the first electrode 110 in FIG. 7F) of the organic light-emitting layers on the first electrode 110, and the organic light-emitting layers are formed in the defined printing regions. In addition, the third via 117 that penetrates through the pixel definition layer 112 is formed in the pixel definition layer 112. A material of the pixel definition layer 112 may be the same as the material of the buffer layer 103.

Figure 7G:
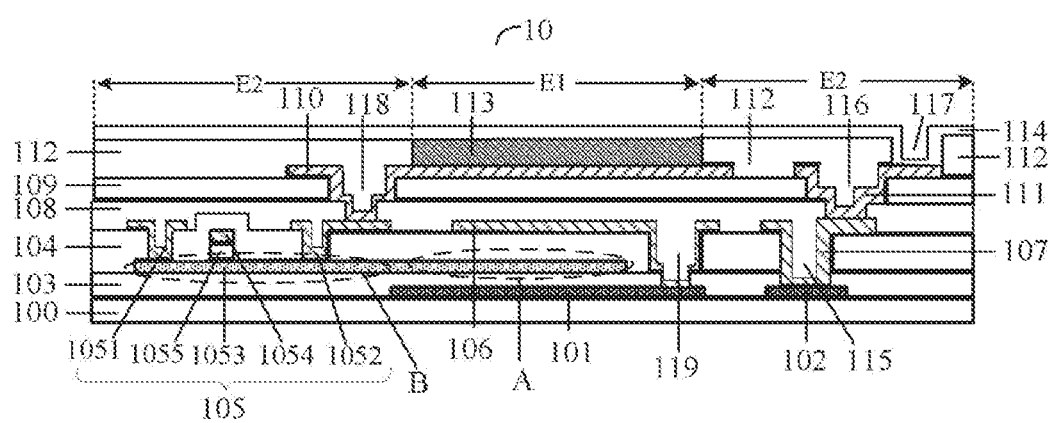

As shown in FIG. 7G, in the printing regions defined by the pixel definition layer 112, the organic light-emitting layers 113 are formed by an ink jet printing (IJP) process. The Ink jet printing process is a printing technology with non-contact, non-pressure and non-plate, which utilizes an external force to extrude a solution such as an ink droplet in a nozzle from the nozzle, and the solution is jet-deposited at corresponding positions to form a required pattern. Therefore, the ink jet printing process has a precise positioning function, and the solution such as the ink droplet is jet-deposited at specific positions as required to form the required pattern. For example, in a case where the organic light-emitting layers 113 are prepared using the ink jet printing process, an ink jet device may jet the solution into the printing regions defined by the pixel definition layer 112 of the array substrate 10 effectively and accurately, thereby forming the required organic light-emitting layers 113. For example, the organic light-emitting layers 113 may be red light-emitting layers, green light-emitting layers and blue light-emitting layers, so that a display device including the organic light-emitting layers 113 may realize a color display. As shown in FIG. 7G, the organic light-emitting layer 113 is located in the light-emitting region E1 of the array substrate 10, and the first auxiliary electrode 102, the second auxiliary electrode 107 and the third auxiliary electrode 111 are all located in the non-light-emitting region E2 of the array substrate 10.

Finally, a conductive film layer is deposited by a sputtering process, and the conductive film layer is patterned to form the second electrodes 114. The second electrodes 114 cover the pixel definition layer 112 and the organic light-emitting layers 113. The second electrode 114 may be a cathode of the organic light-emitting element. The second electrode 114 is electrically connected to the third auxiliary electrode 111 through the third via 117. It is known in combination with the above description that, the second electrode 114 may be electrically connected to the first auxiliary electrode 102 by means of the second auxiliary electrode 107 and the third auxiliary electrode 111. For example, in order to better realize the top emission of the organic light-emitting element, a material of the second electrode 114 may generally be a transparent conductive material, and the transparent conductive material includes, but is not limited to, one or more of ITO, IZO, IGZO and ZnO.

Technical effects of the method for manufacturing the array substrate may be referred to the technical effects of the array substrate 10 described in the above embodiments, which will not be repeated herein.

It will be noted that, the above-mentioned embodiments are used to illustrate rather than limit the present disclosure, and those skilled in the art will be able to design many alternative embodiments without departing from the scope of the appended claims. In the claims, any reference signs placed between parentheses shall not be construed as limiting the claims. The use of the verb "comprise/include" and its conjugations does not exclude the presence of elements or steps other than those stated in the claims. The article "a" or "an" before an element does not exclude the presence of a plurality of such elements. The mere fact that certain measures are recited in mutually different dependent claims does not indicate that a combination of these measures cannot be used to benefit. The protection scope of the present disclosure is determined by the appended claims.

The forgoing descriptions are merely specific implementations of the present disclosure, but the protection scope of the present disclosure is not limited thereto. Variations or substitutions that any person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising:
a base;
light shield layers and a first auxiliary electrode that are disposed on the base;
at least one insulating layer covering the light shield layers and the first auxiliary electrode;
first electrodes that are disposed on the at least one insulating layer;
a conductive connection portion electrically connected to the first auxiliary electrode through a via that penetrates through the at least one insulating layer;
a pixel definition layer defining light-emitting regions and covering the conductive connection portion;
organic light-emitting layers disposed on the first electrodes and located in the light-emitting regions defined by the pixel definition layer; and
at least one second electrode covering the pixel definition layer and the organic light-emitting layers, and a second electrode in the at least one second electrode being electrically connected to the conductive connection portion through a via that penetrates through the pixel definition layer;
wherein the at least one insulating layer includes:
a buffer layer covering the light shield layers and the first auxiliary electrode, and an interlayer dielectric layer disposed on the buffer layer; the via that penetrates through the at least one insulating layer including a first via that penetrates through the interlayer dielectric layer and the buffer layer; and
the conductive connection portion includes:
a second auxiliary electrode disposed on the interlayer dielectric layer, the second auxiliary electrode being electrically connected to the first auxiliary electrode through the first via that penetrates through the interlayer dielectric layer and the buffer layer;
wherein the at least one insulating layer further includes:
a planarization layer covering the second auxiliary electrode;
the via that penetrates through the at least one insulating layer including a second via that penetrates through the planarization layer; and
the conductive connection portion further includes:
a third auxiliary electrode disposed on the planarization layer, the third auxiliary electrode and the first electrode being disposed in a same layer;

the third auxiliary electrode is electrically connected to the second auxiliary electrode through the second via that penetrates through the planarization layer; and the via that penetrates through the pixel definition layer is a third via, and the second electrode is electrically connected to the third auxiliary electrode through the third via;

the array substrate further comprising:
thin film transistors disposed between the buffer layer and the planarization layer, a first electrode in the first electrodes being electrically connected to a corresponding thin film transistor through a fourth via that penetrates through the planarization layer;

wherein active layers of the thin film transistors are disposed between the buffer layer and the interlayer dielectric layer, and sources and drains of the thin film transistors are disposed on the interlayer dielectric layer;

an active layer in the active layers includes a first portion that overlaps with a corresponding organic light-emitting layer in a direction perpendicular to the base and a second portion that is non-overlapping with the corresponding organic light-emitting layer in the direction perpendicular to the base, and a source and a drain of a thin film transistor in the thin film transistors are electrically connected to a second portion of a corresponding active layer through vias that penetrate through the interlayer dielectric layer, respectively; and capacitor electrodes disposed between the interlayer dielectric layer and the planarization layer, a capacitor electrode in the capacitor electrodes being directly electrically connected to a corresponding light shield layer through a fifth via that penetrates through the interlayer dielectric layer and the buffer layer, and partially overlapping with the corresponding active layer.

2. The array substrate according to claim 1, wherein an orthographic projection of a first electrode in the first electrodes on the base at least partially overlaps with an orthographic projection of the corresponding organic light-emitting layer on the base, and an orthographic projection of the third auxiliary electrode on the base is non-overlapping with orthographic projections of the organic light-emitting layers on the base.

3. The array substrate according to claim 1, wherein orthographic projections of sources and drains of the thin film transistors on the base are non-overlapping with orthographic projections of the organic light-emitting layers on the base, and an orthographic projection of the second auxiliary electrode on the base is non-overlapping with the orthographic projections of the organic light-emitting layers on the base.

4. The array substrate according to claim 1, wherein an orthographic projection of a light shield layer in the light shield layers on the base at least partially overlaps with an orthographic projection of an active layer of the corresponding thin film transistor on the base.

5. The array substrate according to claim 1, wherein the first auxiliary electrode includes a body portion and an extension portion that extends from the body portion toward the corresponding light shield layer; and an orthographic projection of the extension portion on the base covers an orthographic projection of the first via on the base, and the orthographic projection of the extension portion on the base is non-overlapping with orthographic projections of the active layers on the base.

6. The array substrate according to claim 5, further comprising:
data lines disposed on the base, the first auxiliary electrode and the data lines being disposed in different layers.

7. The array substrate according to claim 6, wherein the body portion extends in a direction parallel to the data lines, and the extension portion extends in a direction perpendicular to the data lines.

8. The array substrate according to claim 1, wherein an orthographic projection of a light shield layer in the light shield layers on the base at least partially overlaps with an orthographic projection of the corresponding organic light-emitting layer on the base, and an orthographic projection of the first auxiliary electrode on the base is non-overlapping with the orthographic projections of the organic light-emitting layers on the base.

9. A display panel, comprising:
the array substrate according to claim 1.

10. A display device, comprising:
the display panel according to claim 9.

11. A method for manufacturing an array substrate, comprising:
providing a base;
forming light shield layers and a first auxiliary electrode on the base;
forming at least one insulating layer covering the light shield layers and the first auxiliary electrode;
forming first electrodes on the at least one insulating layer and a conductive connection portion, wherein the conductive connection portion is electrically connected to the first auxiliary electrode through a via that penetrates through the at least one insulating layer;
forming a pixel definition layer that covers the conductive connection portion, wherein the pixel definition layer is configured to define light-emitting regions;
forming organic light-emitting layers on the first electrodes and in the light-emitting regions defined by the pixel definition layer; and
forming at least one second electrode that covers the pixel definition layer and the organic light-emitting layers, wherein a second electrode in the at least one second electrode is electrically connected to the conductive connection portion through a via that penetrates through the pixel definition layer;
wherein forming the at least one insulating layer covering the light shield layers and the first auxiliary electrode, includes:
forming a buffer layer that covers the light shield layers and the first auxiliary electrode, and an interlayer dielectric layer on the buffer layer; and
forming the first electrodes on the at least one insulating layer and the conductive connection portion, includes:
forming a second auxiliary electrode on the interlayer dielectric layer, wherein the second auxiliary electrode is electrically connected to the first auxiliary electrode through a first via that penetrates through the interlayer dielectric layer and the buffer layer;
wherein forming the at least one insulating layer covering the light shield layers and the first auxiliary electrode, further includes:
forming a planarization layer that covers the second auxiliary electrode; and forming the first electrodes on the at least one insulating layer and the conductive connection portion, further includes:
forming the first electrodes and a third auxiliary electrode on the planarization layer, wherein the third auxiliary electrode is electrically connected to the second auxiliary electrode through a second via that penetrates through the planarization layer; the via that penetrates through the pixel definition layer is a third via, and the second electrode is electrically connected to the third auxiliary electrode through the third via;
wherein before forming the planarization layer, the method further comprises:
forming thin film transistors on the buffer layer, includes:
forming active layers on the buffer layer;
forming a gate insulating layer and gates on the active layers; and
forming sources, drains and capacitor electrodes on the interlayer dielectric layer;
wherein a capacitor electrode in the capacitor electrodes is directly electrically connected to a corresponding light shield layer through a fifth via that penetrates through the interlayer dielectric layer and the buffer layer, and partially overlaps with a corresponding active layer;
after forming the planarization layer, a first electrode in the first electrodes is electrically connected to a corresponding thin film transistor through a fourth via that penetrates through the planarization layer.

12. The method according to claim 11, wherein orthographic projections of the first auxiliary electrode, the second auxiliary electrode and the third auxiliary electrode on the base are non-overlapping with orthographic projections of the organic light-emitting layers on the base.

* * * * *